United States Patent
Besinga et al.

(10) Patent No.: US 10,199,111 B1
(45) Date of Patent: Feb. 5, 2019

(54) MEMORY DEVICES WITH READ LEVEL CALIBRATION

(71) Applicant: Micron Technology, Inc., Boise, ID (US)

(72) Inventors: Gary F. Besinga, Boise, ID (US); Peng Fei, Shanghai (CN); Michael G. Miller, Boise, ID (US); Roland J. Awusie, Boise, ID (US); Kishore Kumar Muchherla, Fremont, CA (US); Renato C. Padilla, Folsom, CA (US); Harish R. Singidi, Fremont, CA (US); Jung Sheng Hoei, Newark, CA (US); Gianni S. Alsasua, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/669,055

(22) Filed: Aug. 4, 2017

(51) Int. Cl.
*G11C 16/10* (2006.01)
*G11C 16/28* (2006.01)

(52) U.S. Cl.
CPC .................................. *G11C 16/28* (2013.01)

(58) Field of Classification Search
USPC ...................................................... 365/185.12
See application file for complete search history.

(56) References Cited

U.S. PATENT DOCUMENTS

| | | | |
|---|---|---|---|
| 9,147,486 B2 | 9/2015 | Koudele | |
| 9,455,001 B1 | 9/2016 | Stephens | |
| 9,621,160 B2 * | 4/2017 | Tang | H03K 19/01754 |
| 9,905,302 B2 * | 2/2018 | Karakulak | G11C 16/26 |
| 10,008,273 B2 * | 6/2018 | Ray | G11C 16/0483 |
| 2009/0027970 A1 * | 1/2009 | Roohparvar | G11C 16/10 365/185.18 |
| 2012/0236662 A1 * | 9/2012 | Shizuno | G11C 7/04 365/189.15 |
| 2013/0070524 A1 | 3/2013 | Dutta et al. | |
| 2014/0101519 A1 | 4/2014 | Lee et al. | |
| 2016/0077753 A1 | 3/2016 | Cometti et al. | |
| 2016/0148702 A1 | 5/2016 | Karakulak et al. | |

OTHER PUBLICATIONS

International Application No. PCT/US2018/043876—International Search Report and Written Opinion, dated Nov. 8, 2018, 14 pages.

* cited by examiner

*Primary Examiner* — Hoai V Ho
*Assistant Examiner* — Minh Dinh
(74) *Attorney, Agent, or Firm* — Perkins Coie LLP

(57) ABSTRACT

Several embodiments of memory devices and systems with read level calibration are disclosed herein. In one embodiment, a memory device includes a controller operably coupled to a main memory having at least one memory region and calibration circuitry. The calibration circuitry is operably coupled to the at least one memory region and is configured to determine a read level offset value corresponding to a read level signal of the at least one memory region. In some embodiments, the calibration circuitry is configured to obtain the read level offset value internal to the main memory. The calibration circuitry is further configured to output the read level offset value to the controller.

27 Claims, 7 Drawing Sheets

MEMORY DEVICES WITH READ LEVEL CALIBRATION

TECHNICAL FIELD

The disclosed embodiments relate to memory devices and systems, and, in particular, to memory devices with read level calibration.

BACKGROUND

Memory devices can employ flash media to persistently store large amounts of data for a host device, such as a mobile device, a personal computer, or a server. Flash media includes "NOR flash" and "NAND flash" media. NAND-based media is typically favored for bulk data storage because it has a higher storage capacity, lower cost, and faster write speed than NOR media. The memory cells in NAND flash employ a charge storage structure, (e.g., a floating gate structure or a charge trapping structure) for storing charge to represent different data states. The cells are programmed by transferring electrons through a thin dielectric layer (e.g., a tunnel oxide) from a channel to, e.g., a floating gate or a charge trapping layer within the charge storage structure. The amount of charge stored in a memory cell represents one or more threshold voltages that are indicative of the voltage(s) required to form a conductive path within the channel, (e.g., depending on the amount of electrons stored on the floating gate or the charge trapping layer).

One drawback of flash memory and other non-volatile memory is that the threshold voltages of the individual memory cells can change as, over time, the memory device erases and writes data to the memory. For example, over multiple erase and write cycles, electrons can become trapped within the tunnel oxide of a memory cell, causing the threshold voltage(s) of the cell to gradually increase. This phenomenon, if uncorrected, can result in bit errors during a read of the data stored in the memory cell.

In some circumstances, error correcting code (ECC) techniques may be employed to detect and correct bit errors if the number of bit errors does not exceed the correction capacity of the code. Eventually, however, as more electrons are trapped within the tunnel oxide layers of more and more memory cells in a memory device, the number of memory cells with unreadable data states (e.g., due to shifted threshold voltages) may exceed the correction capacity of the ECC. When this happens, the memory controller is no longer able to efficiently or properly read out data from the affected memory regions.

DETAILED DESCRIPTION

As described in greater detail below, the present technology relates to memory devices and related systems with read level calibration. A person skilled in the art, however, will understand that the technology may have additional embodiments and that the technology may be practiced without several of the details of the embodiments described below with reference to FIGS. 1-6. In the illustrated embodiments below, the memory devices are described in the context of devices incorporating NAND-based storage media (e.g., NAND flash). Memory devices configured in accordance with other embodiments of the present technology, however, can include other types of memory devices and/or can include main memories that are not NAND-based (e.g., NOR-based) or only partially NAND-based.

One embodiment of the present technology is a memory device comprising a controller and a main memory. The main memory includes a memory region having a plurality of memory cells. The main memory also includes calibration circuitry operably coupled to the memory region. The calibration circuitry is configured to (1) measure a performance characteristic for each of a plurality of read level test signals corresponding to portions of the memory region; (2) determine a read level offset value based on the performance characteristics; and (3) output the read level offset value to the controller.

A read level offset value may be used to update a corresponding current read level signal for a portion of the memory region. In this manner, the current read level signals for the main memory of the memory device can be calibrated to account for shifts in the threshold voltages in the memory cells of the main memory, which, in turn, decreases the occurrence of bit errors and increases the life of the memory device.

Figure 1:
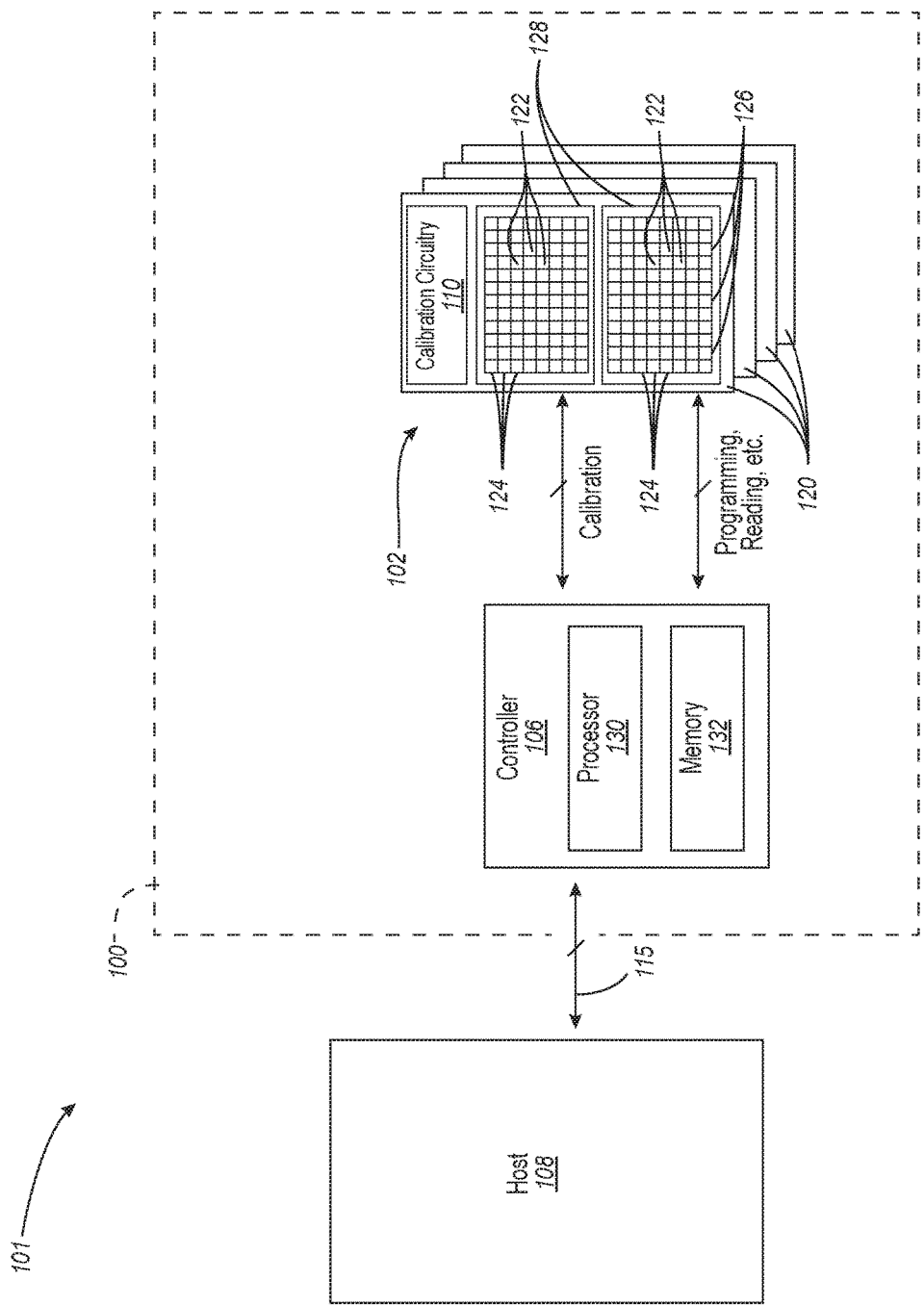
FIG. 1 is a block diagram of a system having a memory device configured in accordance with an embodiment of the present technology.

FIG. 1 is a block diagram of a system 101 having a memory device 100 configured in accordance with an embodiment of the present technology. As shown, the memory device 100 includes a main memory 102 (e.g., NAND flash) and a controller 106 operably coupling the main memory 102 to a host device 108 (e.g., an upstream central processor (CPU)). The main memory 102 includes a plurality of memory regions, or memory units 120, which each include a plurality of memory cells 122. Memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory cells 122 can include, for example, floating gate, charge trap, phase change, ferroelectric, magnetoresitive, and/or other suitable storage elements configured to store data persistently or semi-persistently. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Furthermore, adjacent word lines 124 can be arranged into one or more word line groups that compose a memory block 128. Each word line 124 can span one or more memory pages, depending upon the number of data states the memory cells 122 of that word line 124 are configured to store. For example, a single word line 124 of memory cells 122 in which each memory cell 122 stores one of two data states (e.g., SLC memory cells configured to store one bit each) can span a single memory page. Alternatively, a single word line 124 of memory cells 122 in which each memory cell 122 stores one of four data states (e.g., MLC memory cells configured to store two bits each) can span two memory pages. Moreover, memory pages can be interleaved so that a word line 124 comprised of memory cells 122 configured to store one of two data states in each cell (e.g., SLC memory cells) can span two memory pages, in an "even-odd bit line architecture," where all the memory cells 122 in odd-numbered columns 126 of a single word line 124 are grouped as a first memory page, and all the memory cells 122 in even-numbered columns 126 of the same word line 124 are grouped as a second memory page. When even-odd bit line architecture is utilized in a word line 124 of memory cells 122 that store larger numbers of data states in each cell (e.g., memory cells configured as MLC, TLC, QLC, etc.), the number of memory pages per word line 124 can be even higher (e.g., 4, 6, 8, etc.).

Each column 126 can include a string of series-coupled memory cells 122 coupled to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 122 can be arranged in different types of groups and/or hierarchies than those shown in the illustrated embodiments. Further, while shown in the illustrated embodiments with a certain number of memory cells, rows, columns, blocks, and memory units for purposes of illustration, in other embodiments, the number of memory cells, rows, columns, blocks, and memory units can vary, and can be larger or smaller in scale than shown in the illustrated examples. For example, in some embodiments, the memory device 100 can include only one memory unit 120. Alternatively, memory device 100 can include two, three, four, eight, ten, or more (e.g., 16, 12, 64, or more) memory units 120. While the memory units 120 are shown in FIG. 1 as including two memory blocks 128 each, in other embodiments, each memory unit 120 can include one, three, four eight, or more (e.g., 16, 32, 64, 100, 128, 256 or more memory blocks). In some embodiments, each memory block 128 can include, e.g., $2^{15}$ memory pages, and each memory page within a block can include, e.g., $2^{12}$ memory cells 122 (e.g., a "4 k" page).

The main memory 102 further includes a calibration component, or calibration circuitry 110 (shown schematically), operably coupled to at least one of the memory units 120. In some embodiments, the calibration circuitry 110 can be located on the same memory die as an individual memory unit 120. In these and other embodiments, the calibration circuitry 110 may be dedicated to a corresponding memory unit 120 or multiple memory units, including memory units on different die. The calibration circuitry 110 can include circuit components, such as multiplexers, decoders, buffers, read/write drivers, address registers, data out/data in registers, etc. In some embodiments, the calibration circuitry 110 can be circuitry separate from other on-chip circuitry used for accessing and/or programming (e.g., reading and/or writing) the memory cells 122 and/or for providing other functionality, such as for processing information and/or communication with the controller 106.

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the memory device 100, including managing the main memory 102 and handling communications between the memory device 100 and the host device 108. In some embodiments, the embedded memory 132 can include memory registers storing, e.g., memory pointers, fetched data, etc. The embedded memory 132 can also include read-only memory (ROM) for storing micro-code. While the exemplary memory device 100 illustrated in FIG. 1 has been illustrated as including a controller 106, in another embodiment of the present technology, a memory device may not include a controller, and may instead rely upon external control (e.g., provided by an external host, or by a processor or controller separate from the memory device).

In operation, the controller 106 can directly write or otherwise program (e.g., erase) the various memory regions of the main memory 102, such as by writing to groups of memory pages and/or memory blocks 128. In NAND-based memory, a write operation often includes programming the memory cells 122 in selected memory pages with specific data values (e.g., a string of data bits having a value of either logic 0 or logic 1). An erase operation is similar to a write operation, except that the erase operation re-programs an entire memory block 128 or multiple memory blocks 128 to the same data state (e.g., logic 0).

The controller 106 communicates with the host device 108 over a host-device interface 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation).

The controller 106 can also calibrate signals used to program and read from the main memory 102. In various embodiments described below, the controller 106 can send a calibration signal to the calibration circuitry 110 to instruct the calibration circuitry 110 to self-calibrate one or more memory regions of the main memory 102, which can improve or optimize the signaling (e.g., voltage signaling) used to read the data state of the individual memory cells 122, such as a selected group of memory cells 122 (e.g., multiple memory pages associated with a word line; not shown).

Figure 2:
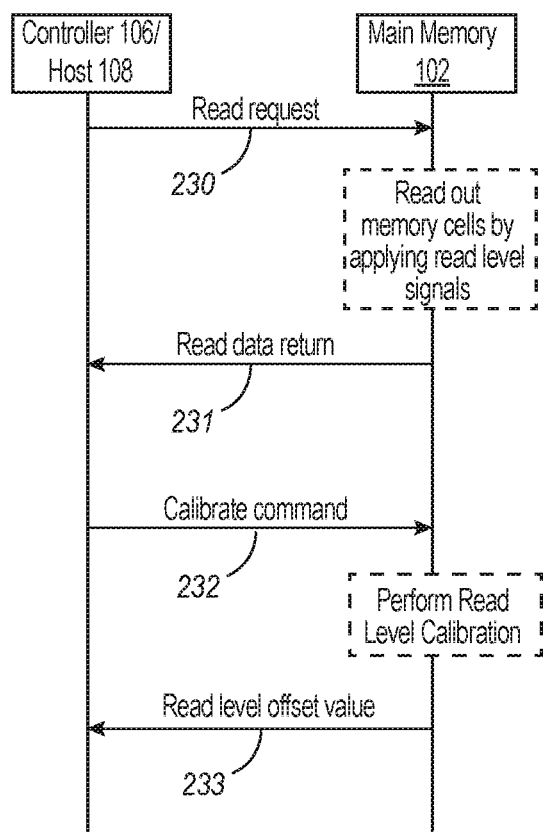
FIG. 2 is a message flow diagram illustrating various data exchanges between components of a memory device in accordance with an embodiment of the present technology.

FIG. 2 is a message flow diagram illustrating various data exchanges between the main memory 102 (FIG. 1) and the controller 106 (FIG. 1) of the memory device 100 (FIG. 1) and/or the host device 108 (FIG. 1) in accordance with one embodiment of the present technology. The controller 106 can read from the main memory 102 by sending a read request 230 to the main memory 102. The read request 230 can include physical addresses of one or more memory regions within the main memory 102 and/or read level signals (e.g., read level voltages) of those memory regions. In response to the read request 230, the main memory 102 can apply the read level signals to the corresponding memory regions and read out data states stored on the memory cells 122 (FIG. 1) within the memory regions. The main memory 102 can return the data states of the memory cells 122 to the controller 106 in a read data return message 231.

The controller 106 can also periodically calibrate the read level signals of one or more select memory regions within the main memory 102. The read level signals may be periodically calibrated to account for, e.g., a shift of one or more threshold voltages of memory cells within the memory regions. To calibrate the read level signals of selected memory regions within the main memory 102, the controller 106 can send a calibrate command 232 to the main memory 102. The calibrate command 232 can include physical addresses of the selected memory regions and/or current read level signals (e.g., default read level signals and/or previously calibrated read level signals) of the selected memory regions. In accordance with one embodiment of the present technology, the main memory 102 can calibrate the selected memory regions in response to the calibrate command 232. As part of the calibration, the main memory 102 can return one or more read level offset values 233 to the controller 106 that can represent calculated offsets from the current read level signals of the selected memory regions. The controller 106 can then use the read level offset values 233 to update the current read level signals to arrive at an improved read level signal for the selected memory regions. The controller 106 and the host device 108 may then continue to program and/or read the main memory 102 using the calibrated read level signals.

As shown in FIG. 2, read level calibration in accordance with the present technology occurs internal to the main memory 102. As such, the present technology greatly minimizes the time required to perform read level calibration because it eliminates the need for multiple messages between the controller 106 and the main memory 102. For example, in accordance with one embodiment of the present technology, controller 106 sends a single calibration signal 232 to the main memory 102. In response, the calibration circuitry 110 of the main memory 102 internally performs read level calibration (as described in greater detail below) and outputs a read level offset value 233 to controller 106. Thus, the controller 106 does not need to send multiple read signals to the main memory 102 to calibrate one or more selected memory regions during read level calibration. Therefore, the execution time of read level calibration in accordance with the present technology is reduced, freeing up the memory device 100 to perform other requests and/or tasks.

Figure 3A:
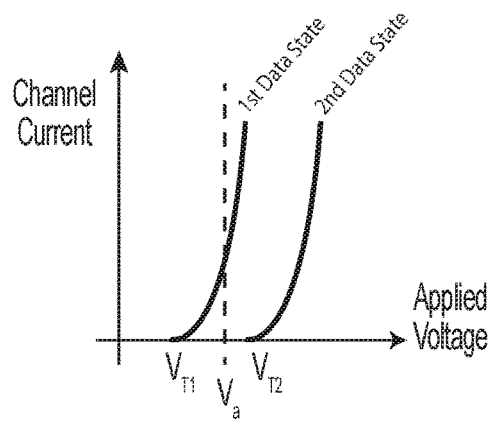
FIGS. 3A and 3B are plots of channel current versus applied voltage of a memory cell within a memory region of a memory device.
Figure 3B:
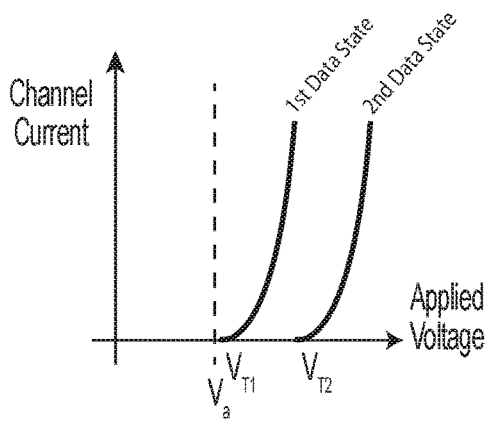

FIGS. 3A and 3B are plots of channel current versus applied voltage of a memory cell, such as one of the memory cells 122 (FIG. 1) within a memory region of the main memory 102 (FIG. 1). Referring to FIG. 3A, the memory cell has a first data state threshold voltage $V_{T1}$ and a second data state threshold voltage $V_{T2}$ representing the voltages required to create a conductive path in the channel of the memory cell programmed with a first data state (e.g., "0") and a second data state (e.g., "1"), respectively. The memory region containing the memory cell has a read level signal $V_a$ (e.g., a read level voltage) between the first data state threshold voltage $V_{T1}$ and the second data state threshold voltage $V_{T2}$. As the read level signal $V_a$ is applied to the memory region, the data state stored on the memory cell may be determined (e.g., read) from the memory cell. For example, if the read level signal $V_a$ is applied to the memory region and current read from the memory cell in response to the read level signal $V_a$ is not negligible (e.g., not zero and/or above a threshold value), the data state stored on the memory cell is determined to be in the first data state (e.g., "0"). If, however, the current read from the memory cell is negligible (e.g., zero and/or below a threshold value), the data state stored on the memory cell illustrated in FIG. 3A is determined to be in the second data state (e.g., "1").

In some memory devices, read level signals of a memory region are initially programmed by the manufacturer of a memory device (e.g., at the time of manufacture or initial configuration) and may thereafter remain unchanged for the life of the memory device. However, as the memory region is repeatedly programmed and/or erased, the threshold voltages of the memory cells within the memory region can change (e.g., due to the trapping of electrons in the tunnel oxides thereof). FIG. 3B illustrates the effect of this phenomenon on the threshold voltages of the memory cell in accordance with one embodiment of the present technology. In the embodiment illustrated in FIG. 3B, the first data state threshold voltage $V_{T1}$ and the second data state voltage $V_{T2}$ have increased in relation to the read level signal $V_a$ of the memory region containing the memory cell. As shown, applying the read level signal $V_a$ will result in a negligible current read from the memory cell regardless of whether the memory cell has been programmed with the first data state or the second data state. In other words, a shift in the threshold voltages of the memory cell in relation to the read level signal of the memory region results in an increased possibility of a bit error from that memory cell. As the occurrence of bit errors begins to gradually increase across multiple memory cells within the memory region, error code correction (ECC) techniques eventually become ineffective, at which point the controller 106 (FIG. 1) may be unable to properly read out the data stored in the memory region. Thus, calibrating the read level signals of the memory regions within a memory device can significantly increase the life of the memory device.

Although the memory cell in FIGS. 3A-B is illustrated with two threshold voltages, memory cells may have a different number of threshold voltages (e.g., four, eight, etc. threshold voltages) representing more than two data states (e.g., four, eight, etc. data states). Similarly, memory regions containing these memory cells may have more than one read level signal (e.g., three, seven, etc. read level signals). Memory cells having a larger number of threshold voltages (e.g., MLC memory cells and TLC memory cells) are more prone to bit errors because the tolerances between data states within the memory cells are smaller. Thus, even a small shift in the threshold voltages of these memory cells can begin causing bit errors within fewer write and erase cycles than in memory cells having fewer threshold voltages (e.g., SLC memory cells). Therefore, memory regions containing memory cells having a larger number of threshold voltages can experience a greater benefit from read level signal calibration.

FIGS. 4A-E are various plots, tables, and diagrams illustrating read level calibration of a memory region in accordance with embodiments of the present technology. After the main memory 102 (FIG. 1) receives a calibration command 232 (FIG. 2) from the controller 106 (FIG. 1) that includes, for example, the physical address(es) of the memory region, the calibration circuitry 110 (FIG. 1) of the main memory 102 can apply various test signals (e.g., test voltages) to the memory region to calibrate one or more of the current read level signals (e.g., the current read level voltages) of the memory region. The current read level signals can be the default read level signals (e.g., the default read level voltages) initially programmed by the manufacturer and/or the current read level signals can be previously calibrated read level signals. In the embodiment illustrated in FIGS. 4A-E, read level calibration of current read level signal $V_A$ (e.g., read level signal $V_a$; FIGS. 3A-B) of a memory region is shown. As shown in plot 440 of FIG. 4A, the calibration circuitry 110 applies five test signals to the memory region containing the depicted memory cell. More specifically, the calibration circuitry 110 applies the current read level signal $V_A$ (i.e., center test signal $V_A$), two upper test signals $V_{U1}$, $V_{U2}$ offset (e.g., at 20 mV intervals) above the center test signal $V_A$, and two lower test signals $V_{L1}$, $V_{L2}$ offset (e.g., at 20 mV intervals) below the center test signal $V_A$. In other embodiments, the calibration circuitry 110 can apply a different number of test signals (e.g., three, seven, nine, etc. test signals) to the memory region and/or can apply a different arrangement of test signals (e.g., three upper test signals and one lower test signal or vice versa) to the memory region. In these and other embodiments, the test signals may be uniformly spaced apart and/or the spacing between the test signals may vary.

Figure 4A:
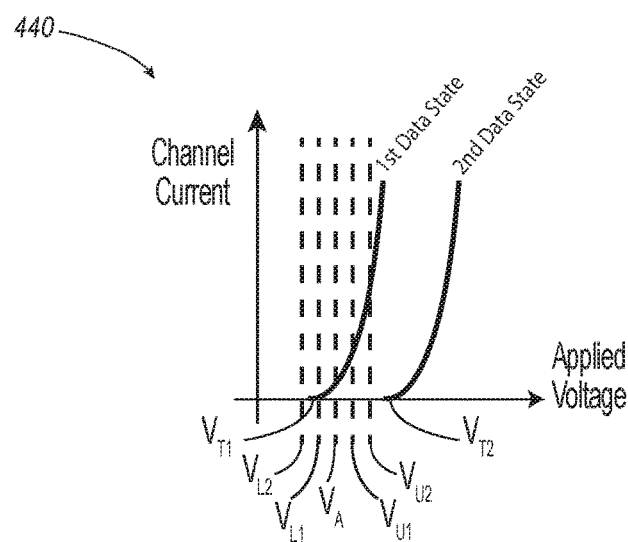
FIGS. 4A-E are various plots, tables, and diagrams illustrating read level calibration of a memory region in accordance with the present technology.
Figures 4B, 4C:
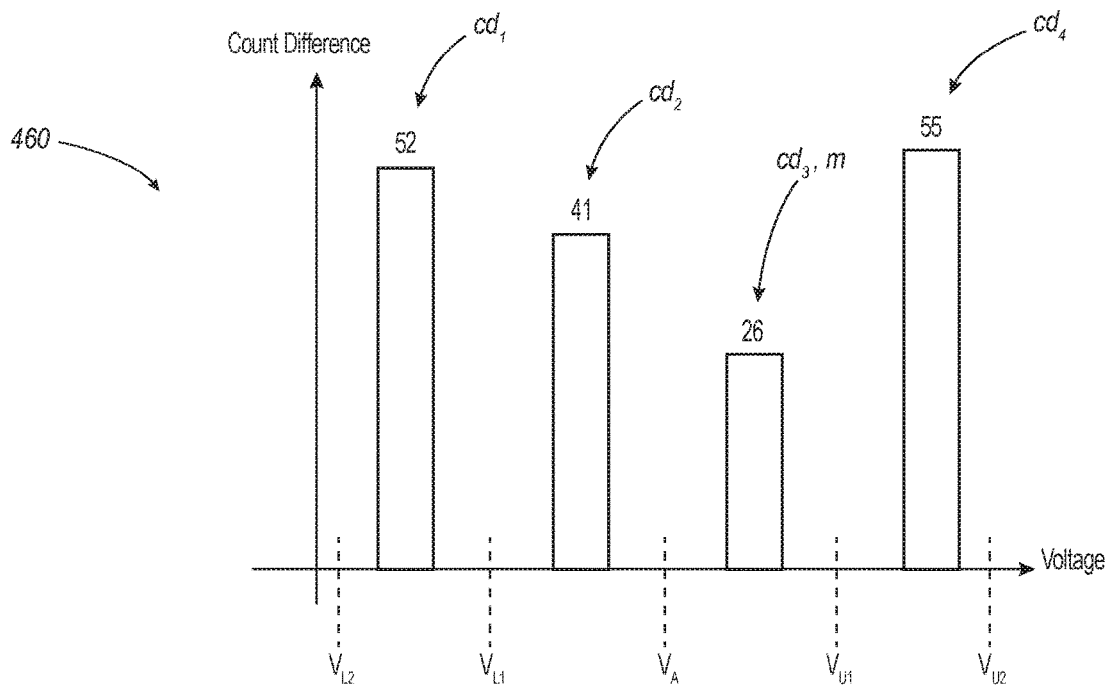

Referring to FIGS. 4B and 4C, as the calibration circuitry 110 applies each of the test signals to the memory region, the calibration circuitry 110 can determine a number of memory cells within the memory region (i.e., a count) that output a specified data state (e.g., a current above a threshold value and/or a current below a threshold value). In the embodiment illustrated in FIG. 4B, the calibration circuitry 110 determines a count as each of the test signals $V_{L2}$, $V_{L4}$, $V_A$, $V_{U1}$, $V_{U2}$ are applied to the memory region. As shown in table 450 of FIG. 4B, when the calibration circuitry 110 applies the lower test signal $V_{L2}$ to the memory region, 586 memory cells output the specified data state. Similarly, when the calibration circuitry 110 applies the lower test signal $V_{L4}$, 534 memory cells output the specified data state; when the calibration circuitry 110 applies the center test signal $V_A$, 493 memory cells output the specified data state; when the calibration circuitry 110 applies the upper test signal $V_{U1}$, 467 memory cells output the specified data state; and when the calibration circuitry 110 applies the upper test signal $V_{U2}$ to the memory region, 411 memory cells output the specified data state.

After the calibration circuitry 110 obtains counts indicative of the number of memory cells that output the specified data state as each test signal is applied to the memory region, the calibration circuitry 110 can calculate count differences between the counts corresponding to adjacent test signals. For example and as shown in table 450 of FIG. 4B, the calibration circuitry 110 calculates four count differences $cd_1$-$cd_4$ as follows: (1) the count difference between the lower test signal $V_{L2}$ and the lower test signal $V_{L1}$; (2) the count difference between the lower test signal $V_U$ and the center test signal $V_A$; (3) the count difference between the center test signal $V_A$ and the upper test signal $V_{U1}$; and (4) the count difference between the upper test signal $V_{U1}$ and the upper test signal $V_{U2}$. The calibration circuitry 110 can then compare the count differences to determine a minimum count difference. As shown in table 450 of FIG. 4B and histogram 460 of FIG. 4C, the count difference $cd_3$ (i.e., the difference between the center test signal $V_A$ and the upper test signal $V_{U1}$) is determined to be minimum count difference m in the embodiment illustrated in FIGS. 4A-E.

Figures 4D, 4E:
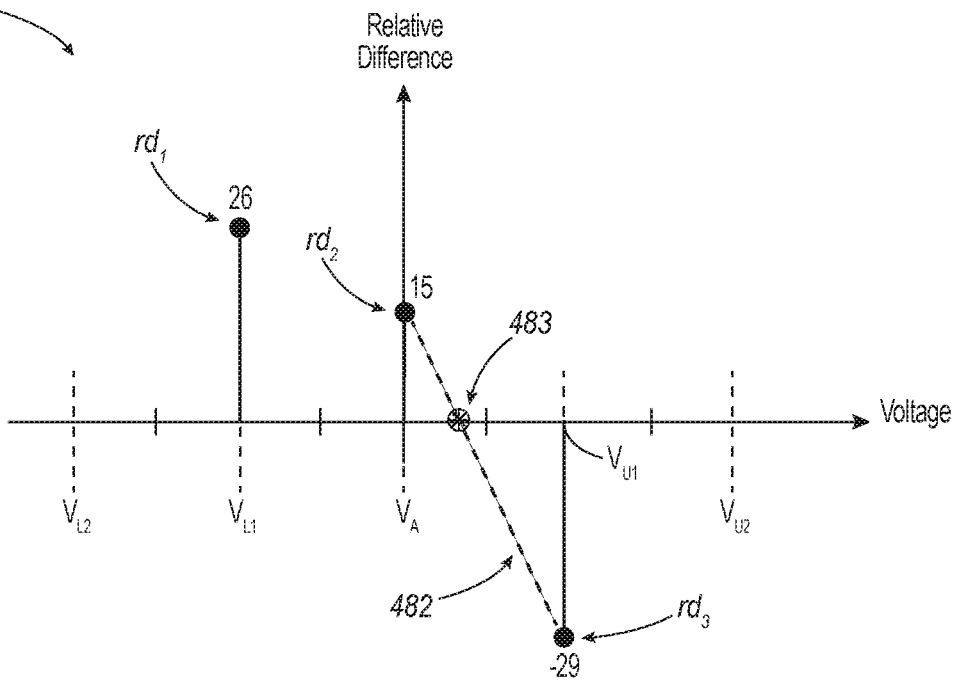

Referring now to FIG. 4D, once the calibration circuitry 110 obtains the minimum count difference, the calibration circuitry 110 can calculate differences between the other count differences and the minimum count difference (i.e., differences relative to the minimum count difference). For example and as shown in table 470 of FIG. 4D, the calibration circuitry 110 can calculate relative differences $rd_1$-$rd_3$ between each of the count differences $cd_1$, $cd_2$, $cd_4$ and the minimum count difference m (i.e., the count difference $cd_3$). As shown in the illustrated embodiment, the relative difference $rd_1$ between the count difference $cd_1$ and the minimum count difference m is 26. Similarly, the relative difference $rd_2$ between the count difference $cd_2$ and the minimum count difference m is 15, and the relative difference $rd_3$ between the minimum count difference m and the count difference $cd_4$ is −29. The relative difference $rd_3$ is represented as a negative value in the illustrated embodiment because this relative difference corresponds to test signals, counts, and a count difference that are offset above and to the right of the minimum count difference m.

After the calibration circuitry 110 calculates the relative differences between the other count differences and the minimum count difference, the calibration circuitry 110 can extrapolate a value between adjacent relative differences having opposite signs (i.e., between relative differences corresponding to count differences adjacent to and surrounding the minimum count difference). FIG. 4E is a plot 480 graphically representing the extrapolation calculation. As shown, a sign change occurs between the graphical representation of the relative difference $rd_2$ and the graphical representation of the relative difference $rd_3$. Thus, the relative differences $rd_2$ and the relative difference $rd_3$ are the relative differences corresponding to the count differences adjacent to and surrounding the minimum count difference m. In contrast, no sign change occurs between the graphical representation of the relative difference $rd_1$ and the graphical representation of the relative difference $rd_2$. Therefore, the calibration circuitry 110 extrapolates a value 483 between the relative difference $rd_2$ and the relative difference $rd_3$ in the illustrated embodiment. In the plot 480 of FIG. 4E, an extrapolation curve 482 is shown intersecting the peaks of the graphical representation of the relative difference $rd_2$ and the graphical representation of the relative difference $rd_3$. In this embodiment, the extrapolated value 483 corresponds to the point at which the extrapolation curve 492 crosses the x-axis of plot 480. Following this extrapolation, calibration circuitry 110 can determine a read level offset value corresponding to a distance between the current read level signal (e.g., the center test voltage $V_A$) and the extrapolated value.

In some embodiments, the read level offset value can be rounded to a nearest offset step value (e.g., the nearest 5 mV or 10 mV offset step value) to facilitate easier storage as an integer value (e.g. a byte and/or a signed integer value). For example, in the embodiment illustrated in FIG. 4E, where the center test signal $V_A$ and the upper test signal $V_{U1}$ are separated by 20 mV, the read level offset value can represent an offset of about 7 mV above the center test signal $V_A$. If the memory device is configured to round read level offset values to the nearest ±10 mV offset step value, then the read level offset value of +7 mV would be rounded to a value of +10 mV (e.g., the calibration circuitry 110 would return a value of +10 mV indicating that the read level signal should be about 10 mV above the center test signal $V_A$). Similarly, if the read level offset value was calculated for a another memory region to be 4 mV above the center test signal $V_A$, and the memory device was configured to round an read level offset value to the nearest ±10 mV offset step value, then the read level offset value of +4 mV would be rounded to a value of 0 mV (e.g., the calibration would return a 0 mV value indicating that the read level signal did not require an offset).

In some embodiments, the memory region can be a memory page within a larger memory region (e.g., a memory block, a memory unit, etc.) and/or a memory block within a larger memory region (e.g., a memory unit). In these and other embodiments, read level calibration can be performed on more than one memory page and/or on more than one memory block within a larger memory region. As such, the calibration circuitry 110 can produce multiple read level offset values by performing read level calibration on the larger memory region (e.g., on all or a subset of the memory pages and/or on all or a subset of the memory blocks comprising the larger memory region). In such an embodiment, the calibration circuitry 110 can calculate an average read level offset value for the larger memory region from the multiple read level offset values in the manner described in greater detail with reference to FIGS. 5A-B, below.

Figure 5A:
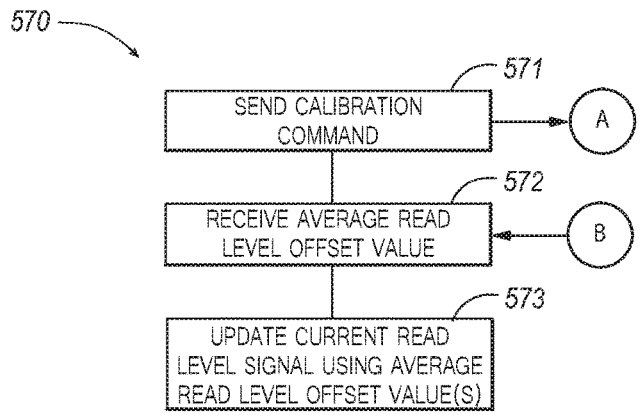
FIGS. 5A and 5B are flow diagrams illustrating methods for operating a memory device in accordance with an embodiment of the present technology.
Figure 5B:
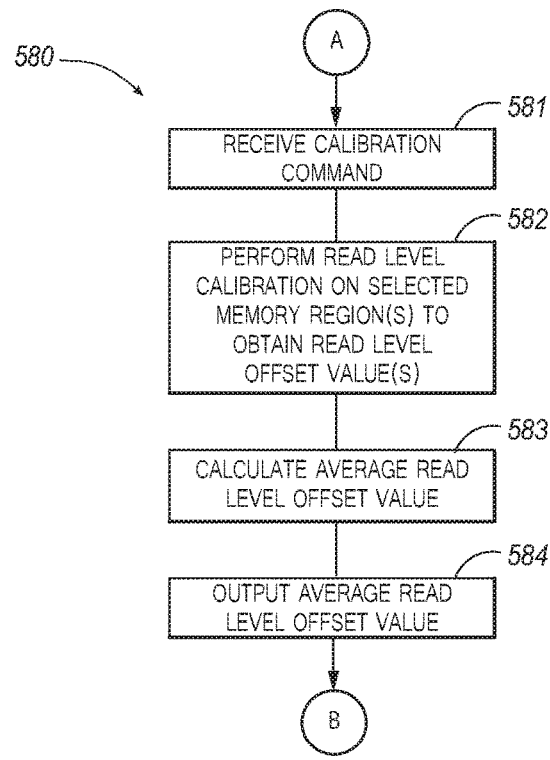

FIGS. 5A and 5B are flow diagrams illustrating routine 570 and routine 580, respectively, for operating a memory device in accordance with an embodiment of the present technology. Routine 570 can be executed, for example, by the controller 106 (FIG. 1) of the memory device 100 (FIG. 1), and routine 580 can be executed, for example, by the calibration circuitry 110 (FIG. 1) of the main memory 102 (FIG. 1) of the memory device 100. In one embodiment, the routine 570 and the routine 580 can be carried out automatically after the controller 106 has programmed (e.g., written to and/or erased) one or more memory regions of the main memory 102 a predefined number of times (e.g., 1, 25, 100, 400, 800, 1000, 10000, etc. times). In other embodiments, the routine 570 and the routine 580 can be carried out in response to a calibration command that originates from the host device 108 (FIG. 1). In still other embodiments, the routine 570 and the routine 580 can be carried out upon the occurrence of other events, e.g., after a specified amount of time has elapsed, after the memory device 100 is first powered on or connected to a host device, and/or upon completion of other commands (e.g., read commands).

Referring to FIG. 5A, the routine 570 begins by sending a calibration command (block 571), such as calibration command 232 of FIG. 2, to the routine 580 containing, e.g., one or more logical addresses of selected memory regions (e.g., of one or more selected memory pages, blocks, logic units, etc.) of the main memory 102 and/or one or more current read level signals (e.g., current read level voltages) of the selected memory regions. As discussed above, the current read level signals may be default read level signals (e.g., default read level voltages) initially programmed by the manufacturer and/or the current read level signals may be read level signals (e.g., read level voltages) previously calibrated in accordance with the present technology. In some embodiments, the one or more memory regions are indicated by the calibration command 571 (e.g., the regions can be selected by the controller 106 or the host device 108). In other embodiments, the calibration circuitry 110 can select the one or more memory regions in response to the calibration command 571 and/or retrieve (e.g., from a table stored within the main memory 102 and/or the embedded memory 132 of controller 106) the corresponding current read level signal(s) for the selected memory region(s).

Referring now to FIG. 5B, the routine 580 receives the calibration command (block 581). The routine 580 proceeds to perform read level calibration on the selected memory regions to produce one or more read level offset values (block 582) in accordance with the discussion of FIGS. 4A-E above. For example, the selected memory regions can be one or more memory units, and the routine 580 can perform read level calibration on a predefined number of memory blocks (e.g., a sampled subset of memory blocks) of each memory unit by, for example, performing read level calibration on a predefined number of memory pages per word line group (e.g., two edge memory pages and a middle memory page per word line group) of each memory block. In other embodiments, the selected memory regions can be one or more memory blocks, and the routine 580 can perform read level calibration on a predefined number of memory pages per word line group (e.g., a sampled subset of memory pages per word line group) within the selected memory blocks.

After the routine 580 obtains the one or more read level offset values produced by performing read level calibration on the selected memory region(s) (block 582), the routine 580 can calculate an average read level offset value (e.g., per memory page, per word line group, per memory block, per memory unit, etc.) (block 583) from the obtained read level offset value(s). For example, the routine 580 can calculate an average read level offset value by taking the median of the obtained read level offset values (e.g., a median byte and/or a median signed integer value). In other embodiments, the routine 580 can calculate the average read level offset value using other averaging techniques (e.g., mean, mode, etc.). In these and other embodiments, the routine 580 can omit outlier read level offset values (e.g., values greater than ±10 digital to analog (DAC) offsets) obtained from performing read level calibration on the selected memory region(s) (block 582) before calculating the average read level offset value (block 583). In some embodiments, the routine 580 can calculate the average read level offset value before rounding to the nearest offset step value. In other embodiments, the routine 580 can calculate the average read level offset value after rounding the obtained read level offset values to the nearest offset step value. Furthermore, in embodiments that produce a single read level offset value after performing read level calibration on the selected memory region(s), the single read level offset value can be treated as an average read level offset value for the selected memory region(s). The routine 580 can then output the average read level offset value to the routine 570 (block 584).

Referring again to FIG. 5A, the routine 570 can receive the average read level offset value from the routine 580 (block 572). The routine 570 can then use the average read level offset value to update the current read level signal for the selected memory region (block 573). For example, the routine 570 can use the average read level offset value (e.g., when the average read level offset value is represented as a byte and/or as a signed integer value) to update a stored calibration value for the read level signal of the selected memory region (block 584). In these embodiments, the current read level signal for the selected memory region can be represented as, for example, the default read level signal plus a calibration value plus other system offsets. The calibration value can initially be set equal to zero when the memory device 100 is initially configured (e.g., at the time of manufacture, or upon initialization), and the routine 570 can update the calibration value by, e.g., adding the average read level offset value received from the routine 580 to the previous calibration value to obtain a new calibration value. For example, in one embodiment, if the previous calibration value was +5 mV (e.g., representing a 5 mV offset above an original read level signal), and the average read level offset value determined by a read level calibration operation is +10 mV (e.g., representing a 10 mV offset above a center test signal of the read level calibration), then the routine 580 can update the stored calibration value by summing the stored calibration value with the average read level offset value to obtain an updated calibration value (e.g., +5 mV summed with +10 mV returns +15 mV).

Accordingly, in subsequent iterations of read level calibration of the selected memory region, the calibration value can be updated by adding the newly-obtained average read level offset value(s) from the routine 580 to the stored calibration value. Thus, the updated calibration value(s) can represent instructions to increase or decrease the current read level signal for the memory region (e.g., by ±5 mV, ±10 mV, ±20 mV, and/or other voltage values) relative to a previous read level signal for the selected memory region in order to arrive at an improved read level signal for the memory region. In these and other embodiments, the routine 570 can store the updated calibration value and/or the updated current read level signal in, for example, a table stored on the main memory 102 and/or embedded memory 132 of the controller 106 of the memory device 100, so that routine 570 can continue to track these values (e.g., as persistent data to be loaded upon each power up of the memory device 100).

While in the foregoing exemplary embodiments, read level calibration operations have been described as outputting values representing offsets by which read level signals can be indexed, the present technology is not limited to this arrangement. In other embodiments, the routine 570 can translate the average read level offset value into, e.g., a scalar value that can represent a scale factor to apply to the current read level signal for the memory region in order to arrive at an improved read level signal. In still other embodiments, a read level calibration operation can translate a calculated average read level offset value into other instructions to update or otherwise modify the current read level signal (e.g., as a read level signal value, instead of an offset to a stored value, etc.).

Figure 6:
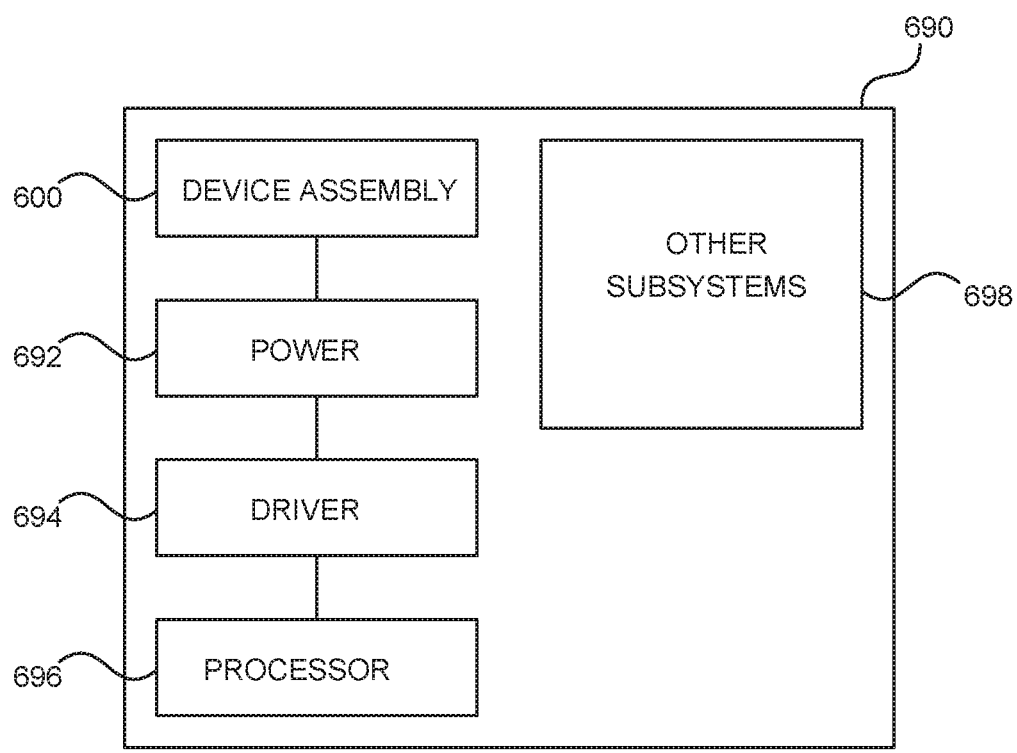
FIG. 6 is a schematic view of a system that includes a memory device in accordance with embodiments of the present technology.

FIG. 6 is a schematic view of a system that includes a memory device in accordance with embodiments of the present technology. Any one of the foregoing memory devices described above with reference to FIGS. 1-5B can be incorporated into any of a myriad of larger and/or more complex systems, a representative example of which is system 690 shown schematically in FIG. 6. The system 690 can include a semiconductor device assembly 600, a power source 692, a driver 694, a processor 696, and/or other subsystems and components 698. The semiconductor device assembly 600 can include features generally similar to those of the memory device described above with reference to FIGS. 1-5B, and can, therefore, include various features that calibrate read level signals. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, vehicles, appliances, and other products. Components of the system 690 may be housed in a single unit or distributed over multiple, interconnected units (e.g., through a communications network). The components of the system 690 can also include remote devices and any of a wide variety of computer readable media.

From the foregoing, it will be appreciated that specific embodiments of the invention have been described herein for purposes of illustration, but that various modifications may be made without deviating from the disclosure. For example, in one embodiment, the calibration circuitry 110 (FIG. 1) can select one or more memory regions to be calibrated absent a calibration command (e.g., a calibration command 232 from the controller 106 and/or from the host device 108; FIGS. 1-2). The calibration circuitry 110 can select the memory regions to be calibrated, for example, based on factors such as the number of times a memory region has been read, erased, and/or written to; the amount of time that has elapsed since the memory region was last calibrated; random sampling (e.g., of one or more memory pages within a memory block, of one or more memory blocks within a memory unit, etc.); and/or in accordance with a predefined order of memory regions. In these and other embodiments, a single component (e.g., the calibration circuitry 110) of system 101 (FIG. 1) can perform each of the steps of the routine 570 and the routine 580 discussed above with respect to FIGS. 5A-B (e.g., absent a calibration command). In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A memory device comprising:
a controller; and
a main memory operably coupled to the controller, wherein the main memory includes:
a memory region having a plurality of memory cells, and
calibration circuitry operably coupled to the memory region and configured to:
measure, for a portion of the memory region, a performance characteristic for each of a plurality of read level test signals,
wherein the plurality of read level test signals include a read level signal of the memory region, at least two signals offset above the read level signal, and at least two signals offset below the read level signal; and
wherein measuring the performance characteristic includes—
applying each of the plurality of read level test signals to a subset of memory cells within the memory region, and
detecting counts of memory cells in the subset of memory cells that output a preselected data state in response to each of the read level test signals,
determine a read level offset value corresponding to an extrapolated level between two of the plurality of read level test signals based on the measured performance characteristics, and
output the read level offset value to the controller.

2. The memory device of claim 1, wherein the memory region comprises a memory block including a plurality of word line groups, and wherein the portion comprises a subset of the plurality of word line groups.

3. The memory device of claim 1, wherein the memory region comprises a memory block including a plurality of word line groups, each word line group having a plurality of memory pages, and wherein the portion comprises two endmost memory pages and an inner memory page from each word line group.

4. The memory device of claim 3, wherein the read level offset value is determined by averaging a plurality of offset values corresponding to the two endmost memory pages and a middle memory page.

5. The memory device of claim 1, wherein the performance characteristic comprises a number of memory cells outputting a predetermined data state in response to the corresponding read level test signal.

6. The memory device of claim 1 wherein the calibration circuitry is configured to output the read level offset value in response to a calibration command received from the controller.

7. The memory device of claim 6, wherein the controller is configured to send the calibration command when the memory region completes a first predetermined number of program cycles, a second predetermined number of erase cycles, or a third predetermined number of either program or erase cycles.

8. The memory device of claim 6, wherein the controller is configured to send the calibration command when the memory device is connected to a host, after a predetermined amount of time has elapsed since the calibration command was last sent, or after a predetermined number of read cycles have been performed on the memory region since the calibration command was last sent.

9. The memory device of claim 6, wherein the controller is configured to send the calibration command in response to a command received from a host device operably connected to the memory device.

10. The memory device of claim 1, wherein the controller is configured to update a read level corresponding to the memory region based on the read level offset value.

11. The memory device of claim 1, wherein the calibration circuitry is located on a same memory die as the memory region.

12. The memory device of claim 1, wherein
determining the read level offset value includes:
measuring count differences between adjacent counts of memory cells,
calculating relative differences at least between the count differences adjacent to the smallest count difference and the smallest count difference,
extrapolating the extrapolated level between the relative differences, and
determining the read level offset value as a distance between the extrapolated level and the read level signal of the memory region.

13. A method for calibrating a memory region of a memory device, the method comprising:
measuring, for a portion of the memory region, a performance characteristic for each of a plurality of read level test signals,
wherein the plurality of read level test signals include a read level signal of the memory region, at least two signals offset above the read level signal, and at least two signals offset below the read level signal, and
wherein measuring the performance characteristic includes—
applying each of the plurality of read level test signals to a subset of memory cells within the portion of the memory region, and
detecting counts of memory cells in the subset of memory cells that output a preselected data state in response to each of the plurality of read level test signals;
determining a read level offset value corresponding to an extrapolated level between two of the plurality of read level test signals based on the measured performance characteristics; and
outputting the read level offset value.

14. The method of claim 13, wherein determining the read level offset includes:
measuring count differences between adjacent counts of memory cells,
calculating relative differences at least between the count differences adjacent to the smallest count difference and the smallest count difference,
extrapolating the extrapolated level between the relative differences, and
determining the read level offset value as a distance between the extrapolated level and the read level signal of the memory region; and
wherein the measuring and determining occurs internal to a main memory comprising the memory region.

15. The method of claim 13 wherein the memory region comprises a memory block including a plurality of word line groups, and wherein the portion comprises a subset of the plurality of word line groups.

16. The method of claim 13 wherein the memory region comprises a memory block including a plurality of word line groups, each word line group having a plurality of memory pages, and wherein the portion comprises two endmost memory pages and a middle memory page from each word line group.

17. The method of claim 16 wherein determining the read level offset value includes averaging a plurality of offset values corresponding to the two endmost memory pages and a middle memory page.

18. The method of claim 17 wherein the averaging includes omitting outlier offset values from the plurality of offset values before determining the read level offset value.

19. The method of claim 13 wherein the measuring, determining, and outputting are scheduled to be performed after the memory region has experienced a first predetermined number of program cycles, a second predetermined number of erase cycles, or a third predetermined number of either program cycles or erase cycles.

20. The method of claim 13 further comprising updating a read level signal of the memory region using the read level offset value.

21. The method of claim 20 wherein updating the read level signal includes updating a calibration value corresponding to the read level offset value.

22. The method of claim 21 further comprising storing the updated calibration value as persistent data in a table stored on the memory device, wherein—
the calibration value represents a voltage value to add to or subtract from a corresponding read level signal of the memory region, and
the persistent data is loaded upon each power up of the memory device.

23. A system comprising:
a host device; and
a memory device including:
  a controller; and
  a main memory operably coupled to the host device via the controller, wherein:
    the main memory includes a memory region comprising a plurality of memory cells, and calibration circuitry operably coupled to the memory region, and
    the calibration circuitry is configured to:
      measure, for a portion of the memory region, a performance characteristic for each of a plurality of read level test signals,
        wherein the plurality of read level test signals includes a read level signal of the memory region, at least two signals offset above the read level signal, and at least two signals offset below the read level signal; and
        wherein measuring the performance characteristic includes—
      applying each of the plurality of read level test to a subset of memory cells within the memory region, and
      detecting counts of memory cells that output a preselected data state in response to each of the read level test signals,
      determine a read level offset value corresponding to an extrapolated level between two of the plurality of read level test signals based on the measured performance characteristic, and
      output the read level offset value to the controller.

24. The system of claim 23 wherein the calibration circuitry is configured to output the read level offset value in response to a calibration command from the controller.

25. The system of claim 24 wherein the controller is configured to send the calibration command in response to a calibrate instruction from the host device.

26. The system of claim 23 wherein:
  determining the read level offset value includes:
    measuring count differences between adjacent counts;
    calculating relative differences at least between the count differences adjacent the smallest count difference and the smallest count difference;
    extrapolating the extrapolated level between the relative differences; and
    determining the read level offset value as a distance between the extrapolated level and the read level signal of the memory region.

27. The system of claim 23 wherein the memory device is configured to prevent the host device from reading, programming, and erasing the main memory of the memory device while the calibration circuitry measures the performance characteristic, determines the read level offset value, or outputs the read level offset value.

* * * * *